(12) United States Patent
Matsukizono

(10) Patent No.: US 8,643,010 B2
(45) Date of Patent: Feb. 4, 2014

(54) SEMICONDUCTOR DEVICE, METHOD FOR FABRICATING THE SAME, ACTIVE MATRIX SUBSTRATE, AND DISPLAY DEVICE

(75) Inventor: Hiroshi Matsukizono, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/642,179

(22) PCT Filed: Jan. 26, 2011

(86) PCT No.: PCT/JP2011/000425
§ 371 (c)(1),
(2), (4) Date: Nov. 1, 2012

(87) PCT Pub. No.: WO2011/132351
PCT Pub. Date: Oct. 27, 2011

(65) Prior Publication Data
US 2013/0037800 A1 Feb. 14, 2013

(30) Foreign Application Priority Data

Apr. 21, 2010 (JP) .................. 2010-097981

(51) Int. Cl.
*H01L 29/12* (2006.01)
(52) U.S. Cl.
USPC ............... 257/43; 257/59; 257/E29.296
(58) Field of Classification Search
USPC .......... 257/E29.293, 43, 59, 88, 72, E27.131, 257/E29.296, E27.132, E29.29; 349/4, 42, 349/43, 46, 462; 438/22, 24, 46, 47
See application file for complete search history.

(56) References Cited

U.S. PATENT DOCUMENTS

| | | | | |
|---|---|---|---|---|
| 5,471,330 A | * | 11/1995 | Sarma | 349/43 |
| 2003/0207482 A1 | * | 11/2003 | Lu | 438/29 |
| 2007/0105298 A1 | * | 5/2007 | Lee et al. | 438/197 |
| 2008/0035920 A1 | | 2/2008 | Takechi et al. | |
| 2009/0101895 A1 | * | 4/2009 | Kawamura et al. | 257/43 |
| 2010/0072470 A1 | * | 3/2010 | Yamazaki et al. | 257/43 |
| 2010/0163865 A1 | * | 7/2010 | Arai | 257/43 |

FOREIGN PATENT DOCUMENTS

| | | |
|---|---|---|
| JP | 2008-040343 A | 2/2008 |
| JP | 2009-049243 A | 3/2009 |

OTHER PUBLICATIONS

Official Communication issued in International Patent Application No. PCT/JP2011/000425, mailed on Apr. 19, 2011.

* cited by examiner

*Primary Examiner* — Cuong Q Nguyen
*Assistant Examiner* — Yosef Gebreyesus
(74) *Attorney, Agent, or Firm* — Keating & Bennett, LLP

(57) ABSTRACT

A semiconductor device includes an oxide semiconductor film in which a channel portion is formed and a gate portion arranged to be opposed to the channel portion. A drain portion in which the oxide semiconductor film has been subjected to resistance reduction process and an intermediate area which is provided between the drain portion and the channel portion and has not been subjected to resistance reduction process are formed in the oxide semiconductor film, and the semiconductor device includes a conductive film to block resistance reduction process to the intermediate area at least at a part.

8 Claims, 6 Drawing Sheets

SEMICONDUCTOR DEVICE, METHOD FOR FABRICATING THE SAME, ACTIVE MATRIX SUBSTRATE, AND DISPLAY DEVICE

TECHNICAL FIELD

The present disclosure relates to a semiconductor device, a method for fabricating the semiconductor device, an active matrix substrate, and a display device.

BACKGROUND ART

In recent years, the development of a thin display device such as a liquid crystal display device and an organic EL display device, etc. has been rapidly promoted. In many cases, such a thin display device includes an active matrix substrate on which a switching element is arranged for each one of a plurality of pixels to drive the pixel for the purpose of increasing the visual quality of the display device.

For example, a liquid crystal display device includes an active matrix substrate, an opposing substrate opposed to the active matrix substrate, and a liquid crystal layer provided between the substrates. When the liquid crystal display device performs transparent display, a back light serving as a light device is arranged on an opposite side of the active matrix substrate to a side thereof on which the liquid crystal layer is provided.

As the active matrix substrate, as described, for example, in Patent Document 1, a structure including a pixel electrode formed of an indium tin oxide (ITO) film as a transparent conductive film and a thin-film transistor (TFT) as a switching element connected to the pixel electrode has been generally known. The TFT includes, for example, a semiconductor layer made of poly silicon (p-Si), and has a so-called top-gate type structure.

The active matrix substrate includes a gate insulating film covering the semiconductor layer, an inorganic insulating layer covering the gate insulating film and a gate electrode, and an organic insulating layer stacked on the inorganic insulating layer. On a surface of the organic insulating layer, formed is a pixel electrode. In this structure, the organic insulating layer is provided to prevent short-circuiting between a source electrode formed on a surface of the inorganic insulating layer and the pixel electrode.

Since a plurality of insulating films, i.e., the organic insulating film, the inorganic insulating layer, and the gate insulating film are stacked under the pixel electrode, the stacked films absorb or reflect a part of illuminating light from the back light and, as a result, it is disadvantageously difficult to increase use efficiency of light from the back light.

Also, researches of TFT using a transparent oxide semiconductor film made of, for example, In—Ga—Zn—O as a channel layer have been launched in recent years.

Such oxide semiconductor has high ion binding property, and a difference in electron mobility between crystal and amorphous material is small. Therefore, relatively high electron mobility can be achieved even in an amorphous state. Moreover, there is another advantage of oxide semiconductor that an amorphous film can be formed at room temperature using, for example, sputtering.

For example, in Patent Document 2, as illustrated in FIG. 18 showing an enlarged cross-sectional view of a conventional active matrix substrate 100 including a TFT 101, the active matrix substrate 100 includes a channel portion 114, a source portion 115, a drain portion 116, a pixel electrode 113, a terminal portion 118 of a gate signal line 111, and a terminal portion 117 of a source signal line 112 which are made of the same oxide semiconductor. A gate electrode 110 is arranged to be opposed to the channel portion 114.

In fabricating the active matrix substrate 100, after forming all layer structures on a substrate 102, an opening portion 130 is formed in a protective insulating film 119 as a topmost layer and a gate insulating film 120 provided under the protective insulating film 119 so as to be located at a desired position. Then, an oxide semiconductor film 126 is exposed to reducing plasma or plasma containing a doping element through the opening portion 130, thereby simultaneously reducing resistances of the terminal portions 118 and 117, the source portion 115, the drain portion 116, and the pixel electrode 113.

Thus, by forming the TFT using an oxide semiconductor film, a different structure from the structure in which the plurality of insulating films, i.e., the organic insulating film, the inorganic insulating layer, and the gate insulating film are stacked under the pixel electrode, which has been described before, can be obtained. Therefore, use efficiency of light from a back light can be increased, and also, electron mobility in the TFT can be increased to reduce an off-leakage current.

CITATION LIST

Patent Document

PATENT DOCUMENT 1: Japanese Patent Publication No. 2009-49243
PATENT DOCUMENT 2: Japanese Patent Publication No. 2008-40343

SUMMARY OF THE INVENTION

Technical Problem

However, there is a problem in which in the conventional active matrix substrate 100, when the resistances of the source portion 115 and the drain portion 116, etc. are reduced, the reducing plasma or the plasma containing the doping element expands under the gate electrode 110 and thus resistance of a part of the oxide semiconductor film 126 which is located under the gate electrode 110 and is to serve as the channel portion 114 is also reduced.

As a result, variation in an effective length L in the channel portion 114 is caused, and it is very difficult to obtain stable transistor characteristics.

In view of the foregoing points, the present invention has been devised, and it is a major object of the present invention to form a semiconductor device using an oxide semiconductor film and also achieve stable characteristics of the semiconductor device.

Solution to the Problem

To achieve the above-described object, a semiconductor device according to the present invention includes an oxide semiconductor film in which a channel portion is formed and a gate portion arranged to be opposed to the channel portion of the oxide semiconductor film, a drain portion in which the oxide semiconductor film has been subjected to resistance reduction process and an intermediate area which is provided between the drain portion and the channel portion and has not been subjected to resistance reduction process are formed in the oxide semiconductor film, and a conductive film is arranged to cover the intermediate area so that the intermediate area is not subjected to resistance reduction process.

An active matrix substrate according to the present invention includes an insulative substrate, a plurality of pixel electrodes arranged in a matrix on the insulative substrate, and a thin film transistor provided for each of the plurality of pixel electrodes to be connected the pixel electrode, the thin film transistor includes an oxide semiconductor film in which a channel portion is formed and a gate portion arranged to be opposed to the channel portion of the oxide semiconductor film, the pixel electrode is formed by performing resistance reduction process to a part of the oxide semiconductor film, an intermediate area which is provided between the pixel electrode and the channel portion and has not been subjected to resistance reduction process is formed in the oxide semiconductor film, and a conductive film is arranged to cover the intermediate area so that the intermediate area is not subjected to resistance reduction process.

A display device according to the present invention includes an active matrix substrate, the active matrix substrate includes an insulative substrate, a plurality of pixel electrodes arranged in a matrix on the insulative substrate, and a thin film transistor provided for each of the plurality of pixel electrodes to be connected the pixel electrode, the thin film transistor includes an oxide semiconductor film in which a channel portion is formed and a gate portion arranged to be opposed to the channel portion of the oxide semiconductor film, the pixel electrode is formed by performing resistance reduction process to a part of the oxide semiconductor film, an intermediate area which is provided between the pixel electrode and the channel portion and has not been subjected to resistance reduction process is formed in the oxide semiconductor film, and a conductive film is arranged to cover the intermediate area so that the intermediate area is not subjected to resistance reduction process.

A method for fabricating a semiconductor device according to the present invention includes forming an oxide semiconductor film, forming a conductive film on the oxide semiconductor film, forming a gate portion on the oxide semiconductor film, and while forming a drain portion by performing resistance reduction process to a part of the oxide semiconductor film exposed from the conductive film, forming a channel portion which has not been subjected to resistance reduction process in a part of the oxide semiconductor film opposed to the gate portion and an intermediate area which has not been subjected to resistance reduction process between the channel portion and the drain portion in a part of the oxide semiconductor film opposed to the conductive film.

—Working Effects—

Next, working effects of the present invention will be described.

According to the present invention, a channel portion and a drain portion (a pixel electrode) are formed in an oxide semiconductor film, and an intermediate area is formed in a part of the oxide semiconductor film located between the channel portion and the drain portion (the pixel electrode), so that the channel portion and the drain portion (the pixel electrode) are caused not to be directly adjacent to each other. Furthermore, a conductive film is provided to cover the intermediate area so that the intermediate area is not subjected to resistance reduction process, and thus, when resistance reduction process is performed to the drain portion (the pixel electrode), expansion of resistance reduction process to the channel portion can be prevented to maintain an effective length L of the channel portion under the gate electrode constant. As a result, a semiconductor device can be fabricated using an oxide semiconductor film, and also, characteristics of the semiconductor device can be stabilized.

Moreover, a side portion of the conductive film is formed so that a thickness of the conductive film reduces toward a side of the conductive film, and thus, a part of the oxide semiconductor film located under the side portion can be subjected to resistance reduction process together with the drain portion (the pixel electrode). Therefore, the side portion of the conductive film and the drain portion (the pixel electrode) can be electrically coupled together.

The inclined side portion of the conductive film can be formed, for example, by forming a photoresist on a surface of a conductive material layer formed on the oxide semiconductor film, and wet-etching the conductive material layer while impregnating an interface of the photoresist and the conductive material layer with an etchant. Also, the inclined side of the conductive film can be formed by dry-etching the conductive material layer while gradually removing the photoresist.

Furthermore, the inclined side portion of the conductive film can be formed also by stacking a plurality of conductive material layers on the oxide semiconductor film to control an etching speed for etching each of the conductive material layers.

Advantages of the Invention

According to the present invention, the intermediate area is provided between the channel portion and the drain portion (the pixel electrode), so that the channel portion and the drain portion (the pixel electrode) are caused not to be directly adjacent to each other, and the conductive film is provided to block resistance reduction process to the intermediate area. Thus, when resistance reduction process is performed to the drain portion (the pixel electrode), expansion of resistance reduction process to the channel portion can be prevented, and the effective length L of the channel portion can be maintained constant. As a result, a semiconductor device can be fabricated using an oxide semiconductor film, and also, characteristics of the semiconductor device can be stabilized.

DESCRIPTION OF EMBODIMENTS

Embodiments of the present invention will be hereinafter described in detail with reference to the accompanying drawings. Note that the present invention is not limited to the following embodiments.

First Embodiment

FIGS. 1-13 illustrate a first embodiment of the present invention.

Figure 1:
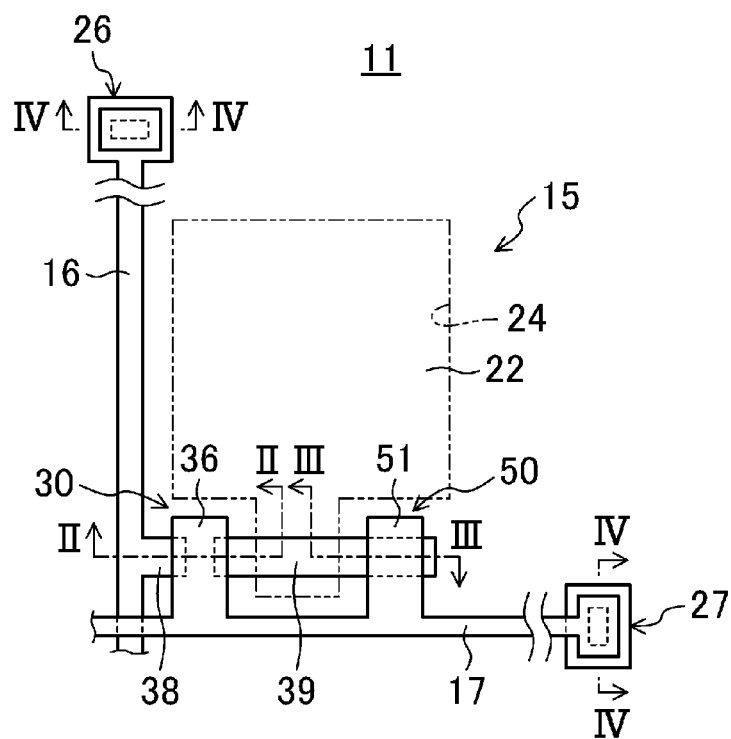
FIG. 1 is an enlarged plan view illustrating a part of a TFT substrate according to a first embodiment of the present invention.
Figure 2:
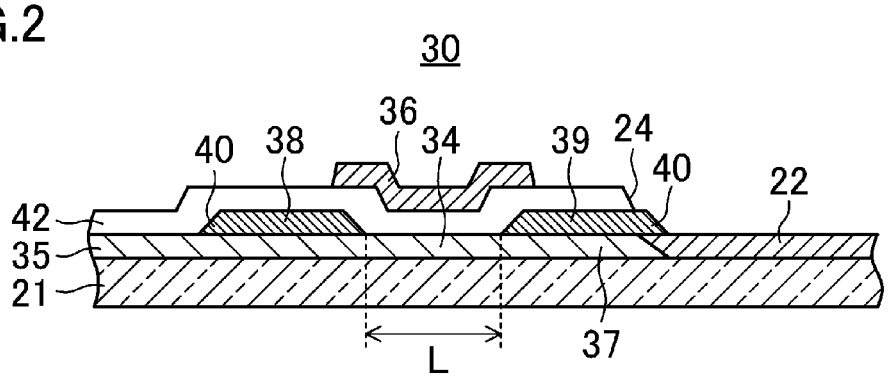
FIG. 2 is a cross-sectional view taken along the line II-II of FIG. 1.
Figure 3:
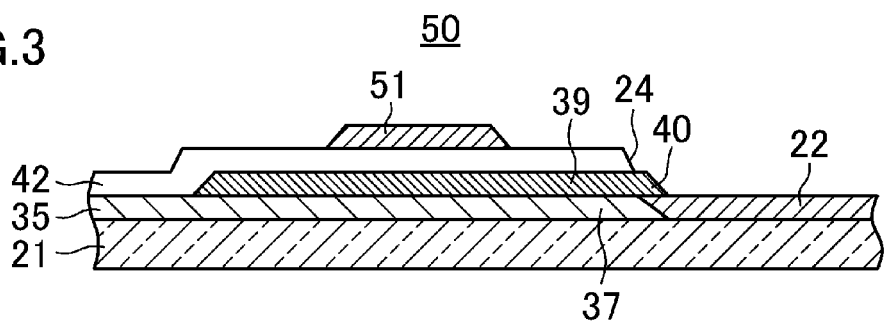
FIG. 3 is a cross-sectional view taken along the line III-III of FIG. 1.
Figure 4:
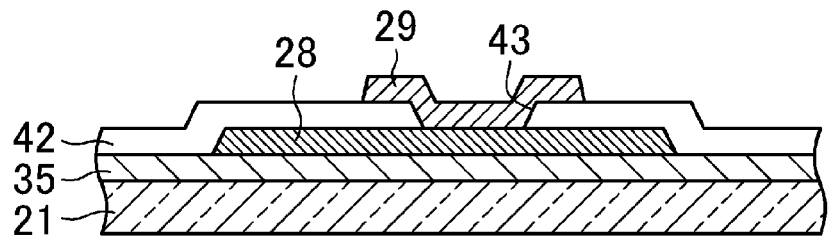
FIG. 4 is a cross-sectional view taken along the line IV-IV of FIG. 1, illustrating a structure of a terminal portion.
Figure 5:
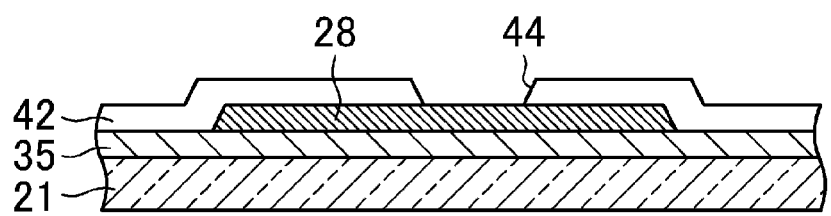
FIG. 5 is a cross-sectional view illustrating another example structure of the terminal portion.
Figure 6:
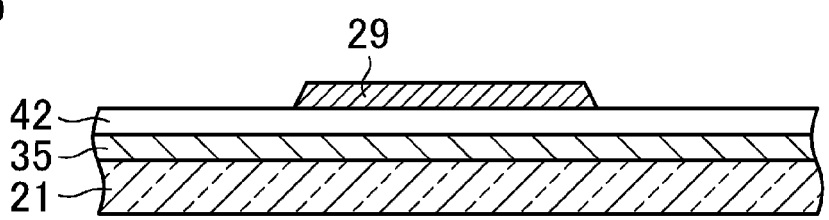
FIG. 6 is a cross-sectional view illustrating another example structure of the terminal portion.
Figure 7:
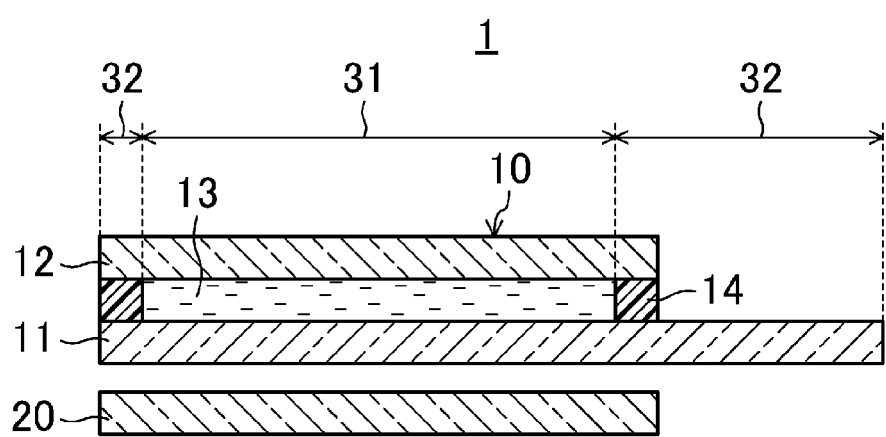
FIG. 7 is a cross-sectional view illustrating a schematic structure of a liquid crystal display device 1 according to the first embodiment.

FIG. 1 is an enlarged plan view illustrating a part of a TFT substrate 11 according to the first embodiment. FIG. 2 is a cross-sectional view taken along the line II-II of FIG. 1. FIG. 3 is a cross-sectional view taken along the line III-III of FIG. 1. FIG. 4 is a cross-sectional view taken along the line IV-IV of FIG. 1, illustrating a structure of a terminal portion. FIG. 5 is a cross-sectional view illustrating another example structure of the terminal portion. FIG. 6 is a cross-sectional view illustrating another example structure of the terminal portion. FIG. 7 is a cross-sectional view illustrating a schematic structure of a liquid crystal display device 1 according to the first embodiment.

—Structure of Liquid Crystal Display Device 1—

First, a structure of the liquid crystal display device 1 will be described.

As shown in FIG. 7, the liquid crystal display device 1 includes a liquid crystal display panel 10 and a back light unit 20 arranged on a back surface side of the liquid crystal display panel 10.

The liquid crystal display panel 10 includes a TFT substrate 11 as an active matrix substrate, an opposing substrate 12 arranged to be opposed to the TFT substrate 11, and a liquid crystal layer 13 provided between the TFT substrate 11 and the opposing substrate 12.

Also, the liquid crystal display device 1 includes a display area 31 and a frame-shaped non-display area 32 provided around the display area 31. In the display area 31, a plurality of pixels 15 are formed to be arranged in a matrix.

The opposing substrate 12 includes an insulative substrate (not shown) such as, for example, a glass substrate, and a color filter and a common electrode, etc. which are not shown in the drawings are formed in the insulative substrate. The liquid crystal layer 13 is sealed by a rim-shaped sealing member 14 provided between the TFT substrate 11 and the opposing substrate 12.

The TFT substrate 11 includes an insulative substrate 21 such as, for example, a glass substrate, a plurality of pixel electrodes 22 (which will be hereinafter also referred to as drain portions) arranged in a matrix on the insulative substrate 21, and thin-film transistors (TFTs) 30 each of which is connected to an associated one of the plurality of pixel electrodes 22.

In the TFT substrate 11, as shown in FIG. 1, a plurality of source lines 16 extending in parallel to one another, and a plurality of gate lines 17 extending perpendicular to the source lines 16 are formed. Specifically, a line group of the gate lines 17 and the source lines 16 is formed so as to be in a lattice form when seen as a whole. The pixels 15 are formed in an area of the lattice form. In each of the pixels 15, an associated one of the pixel electrodes 22 and an associated one of the TFTs 30 are arranged.

The source lines 16 and the gate lines 17 are connected to the TFTs 30. Terminal portions 26 and 27 are formed at end portions of the source lines 16 and the gate lines gate lines 17, respectively. An external circuit (not shown) is mounted at each of the terminal portions 26 and 27.

As shown in FIG. 4, the terminal portion 26 of each the source line 16 and the terminal portion 27 of each gate line 17 have a similar structure. Each of the terminal portions 26 and 27 includes a first pad portion 28 formed on a surface of an oxide semiconductor film 35 and a second pad portion 29 connected to the first pad portion 28 through a through hole 43 formed in a gate insulating film 42.

At the terminal portion 26 of the source line 16, the first pad portion 28 is formed to be integrated with the source line 16. On the other hand, at the terminal portion 27 of the gate line 17, the second pad portion 29 is formed to be integrated with the gate line 17. The terminal portions 26 and 27 are formed into the above-described structure, and thus, the terminal portions 26 and 27 can be formed in the same process step in which the TFTs 30 are formed. Furthermore, the terminal portions 26 and 27 are formed to have a similar structure, so that an external circuit (not shown) such as, for example, FPC connected to an associated one of the terminal portions 26 and 27 can be easily mounted by pressure bonding.

Note that the terminal portions 26 and 27 may be formed to have structures shown in FIGS. 5 and 6. The terminal portion 26 of the source line 16 shown in FIG. 5 includes the first pad portion 28 which is formed on the surface of the oxide semiconductor film 35 and is exposed through an opening portion 44 formed in the gate insulating film 42. The terminal portion 27 of the gate line 17 shown in FIG. 6 includes the second pad portion 29 which is formed on the surface of the gate insulating film 42 on the oxide semiconductor film 35. Even when the terminal portions 26 and 27 are formed to have the above-described structures, the terminal portions 26 and 27 can be formed in the same process step in which the TFT 30 are formed.

(Structure of TFT 30)

As shown in FIG. 2, the TFT 30 includes the oxide semiconductor film 35 in which a channel portion 34 is formed, and a gate portion 36 arranged to be opposed to the channel portion 34 of the oxide semiconductor film 35. The oxide semiconductor film 35 is made of In—Ga—Zn—O (IGZO). Also, the oxide semiconductor film 35 may be made of an oxide containing at least one element of In, Ga, or Zn.

In the oxide semiconductor film 35, formed are the drain portion (the pixel electrode) 22 in which the oxide semiconductor film 35 has been subjected to resistance reduction process, and an intermediate area 37 which is provide between the drain portion (the pixel electrode) 22 and the channel portion 34 and has not been subjected to resistance reduction process.

Resistance reduction process herein means treatment to reduce an electrical resistance of the oxide semiconductor film 35. Examples of resistance reduction process include plasma treatment using a halogen such as hydrogen, chlorine, or fluorine, etc., boron, nitrogen, a noble gas, or a mixed gas containing at least one of the foregoing. As another option, resistance reduction process can be performed by exposing the oxide semiconductor film 35 to plasma containing a doping element (containing at least one element of boron, aluminum, gallium, indium, and fluorine).

On the surface of the oxide semiconductor film 35, formed are the source line 16, a source electrode 38, and a drain electrode 39. The source electrode 38 and the drain electrode 39 are formed of a conductive thin film having a single-layer or stacked-layer structure including, for example, titanium (Ti), aluminum (Al), molybdenum (Mo), copper (Cu), tantalum (Ta), tungsten (W), or nitride of one of the foregoing metals, etc.

Examples of the conductive thin film forming the source electrode 38 and the drain electrode 39 include, for example, Ti/Al/Ti, TiN/Al/Ti, Al/Ti, Mo/Al/Mo, MoN/Al/Mo, MoN/Al/MoN, Cu/Ti, and W/TaN, etc.

The TFT 30 includes the conductive film 39 arranged to cover the intermediate area 37 so that the intermediate area 37 is not subjected to resistance reduction process. A part of the conductive film 39 is opposed to the intermediate area 37. The conductive film 39 of this embodiment is formed of the drain electrode 39. That is, the conductive film 39 can be made of the same material as that of the source electrode 38 and the drain electrode 39.

As shown in FIG. 2, a side portion 40 of the drain electrode (the conductive film) 39 is formed so that a thickness of the drain electrode 39 reduces toward a side of the drain electrode 39. Thus, the side portion 40 of the drain electrode 39 is formed to be inclined. A lower surface of the drain electrode 39 has a larger area than that of an upper surface thereof. A side portion 40 of the source electrode 38 is formed to be inclined in the same manner as the side portion 40 of the drain electrode 39.

As shown in FIG. 2, a boundary of the intermediate area 37 and the drain portion (the pixel electrode) 22 is inclined according to the inclination of the drain electrode 39. The side portion 40 of the drain electrode 39 touches the drain portion (the pixel electrode) 22 to be electrically coupled thereto.

As shown in FIG. 2, the length L of the channel portion 34 of this embodiment is defined to be a distance between the source electrode 38 and the drain electrode 39 when viewed from a normal direction of a surface of the insulative substrate 21.

On the oxide semiconductor film 35, formed is the gate insulating film 42 of, for example, a silicon nitride film. The gate portion 36 is formed on a surface of the gate insulating film 42 to be opposed to the channel portion 34. The gate portion 36 can be made of the same material as that of the source electrode 38 and the drain electrode 39.

As shown in FIG. 1, the gate insulating film 42 is formed so that a part of the gate insulating film 42 is removed within the pixel 15 to form an opening portion 24. A part of the oxide semiconductor film 35 located within the opening portion 24 and exposed from the gate insulating film 42 serves as the pixel electrode (the drain portion) 22.

(Structure of Auxiliary Capacitance 50)

As shown in FIGS. 1 and 3, an auxiliary capacitance 50 to maintain a liquid crystal capacitance formed in the pixel 15 constant is formed in the TFT substrate 11. The auxiliary capacitance 50 includes a capacitance electrode 51 and the drain electrode 39 which are opposed to each other with the gate insulating film 42 interposed therebetween.

The capacitance electrode 51 of the auxiliary capacitance 50 is made of the same material as that of the gate portion 36 of the TFT 30 and formed in the same layer as the gate portion 36. The drain electrode 39 of the auxiliary capacitance 50 is the same drain electrode 39 of the TFT 30. In other words, the auxiliary capacitance 50 includes the drain electrode 39 of the TFT 30 as an auxiliary capacitance electrode.

A part of the oxide semiconductor film 35 located under the auxiliary capacitance 50 is formed to serve as the intermediate area 37, and its boundary with the pixel electrode 22 is formed to be declined in a similar manner to the TFT 30. Thus, the auxiliary capacitance 50 has a similar film structure to that of the TFT 30, and therefore, can be formed simultaneously with the TFT 30.

—Fabrication Method—

Next, a method for fabricating the TFT 30, and the TFT substrate 11 and the liquid crystal display device 1 including the TFT 30 will be described.

Figure 8:
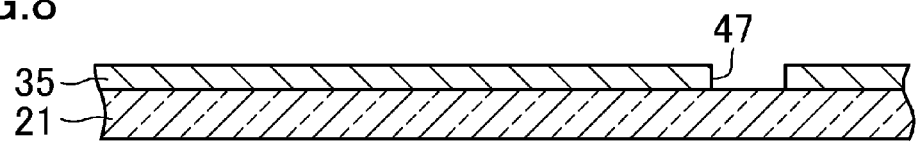
FIG. 8 is a cross-sectional view illustrating an oxide semiconductor film formed on an insulative substrate.
Figure 10:
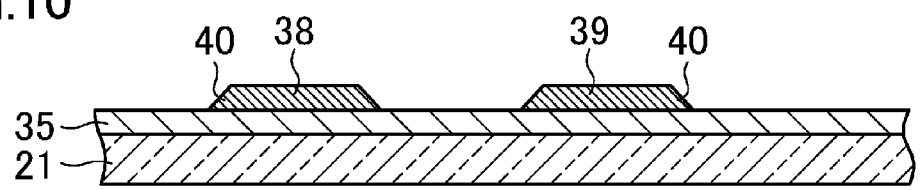
FIG. 10 is a cross-sectional view illustrating a source electrode and a drain electrode formed on the oxide semiconductor film.

FIG. 8 is a cross-sectional view illustrating the oxide semiconductor film 35 formed on the insulative substrate 21. FIG. 10 is a cross-sectional view illustrating the source electrode 38 and the drain electrode 39 formed on the oxide semiconductor film 35.

Figure 9:
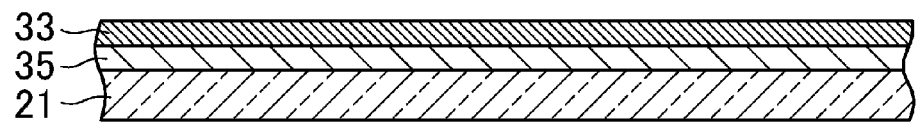
FIG. 9 is a cross-sectional view illustrating a conductive material layer formed on the oxide semiconductor film.
Figure 11:
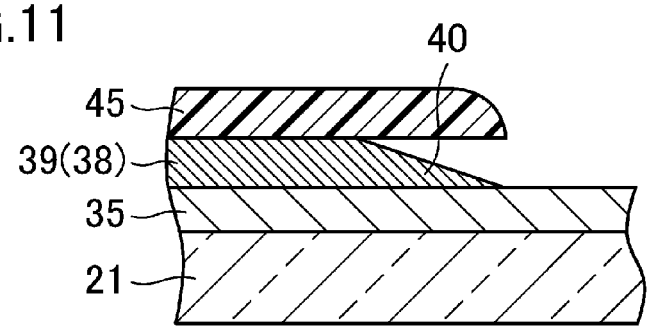
FIG. 11 is an enlarged cross-sectional view illustrating a side portion of the drain electrode to be etched according to the first embodiment.
Figure 12:
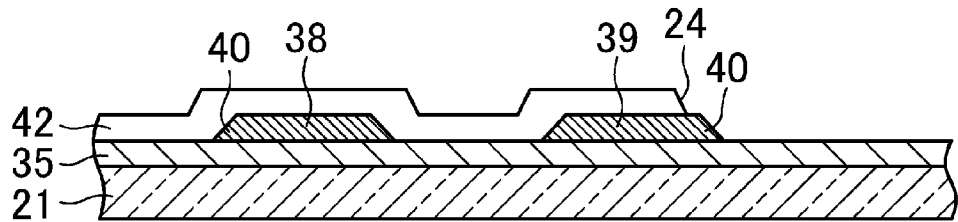
FIG. 12 is a cross-sectional view illustrating a gate insulating film formed on the oxide semiconductor film.
Figure 13:
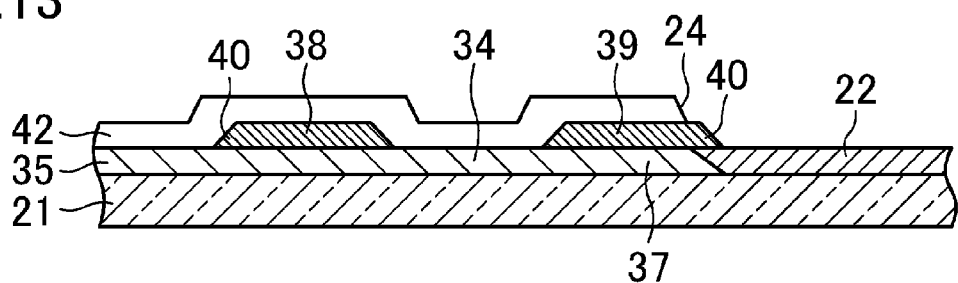
FIG. 13 is a cross-sectional view illustrating a pixel electrode (a drain portion) formed on the oxide semiconductor film.

FIG. 11 is an enlarged cross-sectional view illustrating the side portion 40 of the drain electrode 39 to be etched. FIG. 12 is a cross-sectional view illustrating the gate insulating film 42 formed on the oxide semiconductor film 35. FIG. 13 is a cross-sectional view illustrating the pixel electrode (the drain portion) 22 formed on the oxide semiconductor film 35. FIG. 9 is a cross-sectional view illustrating a conductive material layer formed on the oxide semiconductor film.

(Step of Forming Oxide Semiconductor Film 35)

First, a transparent oxide semiconductor film containing In, Ga, and Zn is formed over substantially an entire transparent insulative substrate 21 such as, for example, a glass substrate.

When the insulative substrate 21 is a glass substrate, a silicon oxide film (not shown) may be formed as a base coat layer on a surface of the insulative substrate 21 as special consideration regarding an impurity contained in glass is required.

Subsequently, as shown in FIG. 8, the oxide semiconductor film 35 is patterned, thereby forming an opening portion 47 in the oxide semiconductor film 35. The reason why the opening portion 47 is formed is that if an oxide semiconductor film is arranged under a gate signal line, a current flows in a gate line as in the TFT 30 when an on signal (a positive voltage) is applied to the gate line, and as a result, a leakage failure occurs between source lines 16 adjacent to each other. Therefore, at least a part of a region of the oxide semiconductor film 35 overlapping the gate line 17 is removed by etching.

(Step of Forming Source Electrode 38 and Drain Electrode 39)

Next, a conductive material layer 33 is formed on the oxide semiconductor film 35, and a photoresist 45 is formed on a surface of the conductive material layer 33. The conductive material layer 33 is thus etched to form a source electrode 38 and a drain electrode 39, as shown in FIG. 10. Note that in this step, the oxide semiconductor film 35 may be patterned using a half exposure technique.

As described above, the conductive material layer 33 can be formed of a conductive thin film having a single-layer or stacked-layer structure including, for example, Ti, Al, Mo, Cu, Ta, W, or nitride of one of the foregoing, etc.

In this step, a side portion 40 of the drain electrode 39 is formed to be inclined so that a thickness of the drain electrode 39 reduces toward a side of the drain electrode 39. Also, a side portion 40 of the source electrode 38 is formed to be inclined in the same manner as the side portion 40 of the drain electrode 39.

As shown in FIG. 11, the inclined side portion 40 can be formed to be inclined by forming a photoresist 45 on the surface of the conductive material layer 33 formed on the oxide semiconductor film 35, and wet-etching the conductive material layer 33 while impregnating an interface of the photoresist 45 and the conductive material layer 33 with an etchant.

The interface of the conductive material layer 33 and the photoresist 45 can be impregnated with an etchant, for example, by fluoridizing the surface of the conductive material layer 33 to reduce adherence of the surface to the photoresist 45 and mixing an surfactant in the etchant.

(Step of Forming Gate Insulating Film 42)

Next, a gate insulating film 42 of a silicon oxide film is formed on the oxide semiconductor film 35 to cover the source electrode 38 and the drain electrode 39. Subsequently, as shown in FIGS. 1 and 12, an opening portion 24 is formed in the gate insulating film 42 by etching.

(Step of Forming Drain Portion (Pixel Electrode) 22)

Next, as shown in FIG. 13, a part of the oxide semiconductor film 35 exposed from the gate insulating film 42 and the drain electrode 39 is subjected to resistance reduction process, thereby forming a drain portion (a pixel electrode) 22. On the other hand, a channel portion 34 which has not been subjected to resistance reduction process is formed in a part of the oxide semiconductor film 35 which is to be opposed to the gate portion 36. Furthermore, an intermediate area 37 which has not been subjected to resistance reduction process is formed between the channel portion 34 and the drain portion (the pixel electrode) 22 in a part of the oxide semiconductor film 35 opposed to the drain electrode 39.

As resistance reduction process, for example, in a state where the insulative substrate 21 on which the oxide semiconductor film 35 is formed is housed in a vacuum chamber (not shown), a hydrogen gas is supplied into the vacuum chamber at a flow rate of 200 sccm. Thus, an inner pressure of the vacuum chamber is caused to be 100 Pa. Furthermore, RF power of 0.1 W/cm$^2$ is applied for 120 seconds to perform plasma treatment. Thus, a drain portion (a pixel electrode) 22 is formed in the part of the oxide semiconductor film 35 exposed through the opening portion 24 of the gate insulating film 42.

In this step, since the side portion 40 of the drain electrode 39 is formed so that the thickness thereof reduces toward the side of the drain electrode 39, a part of the oxide semiconductor film 35 located under the side portion 40 can be subjected to resistance reduction process together with the drain portion (the pixel electrode) 22. Thus, the side portion 40 of the drain electrode 39 and the drain portion (the pixel electrode) 22 can be electrically coupled together.

(Step of Forming Gate Portion 36)

Next, as shown in FIG. 1, a gate portion 36 is formed on the oxide semiconductor film 35. The gate portion 36 is formed by performing photolithography and etching after forming a metal film of the same as, for example, the drain electrode 39 on the surface of the gate insulating film 42. Thus, a TFT 30 is fabricated.

Thereafter, a protective insulating film (not shown) and an oriented film (not shown) are formed on the insulative substrate 21 on which the TFT 30 is formed, thus fabricating a TFT substrate 11. A common electrode of, for example, ITO, a color filter, and an oriented film, etc. are formed in a transparent insulative substrate, thus separately fabricating an opposing substrate 12.

Subsequently, after a rim shape of a sealing member 14 is drawn on the TFT substrate 11 or the opposing substrate 12 and a liquid crystal material is dropped to be supplied to the inside of the sealing member 14, the TFT substrate 11 and the opposing substrate 12 are bonded together, thereby fabricating a liquid crystal display panel 10. Thereafter, with a back light unit 20 arranged at a back surface side of the liquid crystal display panel 10, the liquid crystal display panel 10 and the back light unit 20 are housed in a casing (not shown), thus fabricating a liquid crystal display device 1.

Advantages of First Embodiment

According to the first embodiment, therefore, the intermediate area 37 is provided between the channel portion 34 and the drain portion (the pixel electrode) 22, so that the channel portion 34 and the drain portion (the pixel electrode) 22 are caused not to be directly adjacent to each other, and the drain electrode 39 covering the intermediate area 37 is provided so that the intermediate area 37 is not subjected to resistance reduction process. Thus, when resistance reduction process is performed to the drain portion (the pixel electrode) 22, expansion of resistance reduction process to the channel portion 34 can be prevented, and the effective length L of the channel portion 34 can be maintained constant.

As a result, by using the oxide semiconductor film 35, the electron mobility of the TFT 30 can be increased, the off-leakage current can be reduced, and furthermore, the effective length L of the channel portion 34 can be maintained constant, so that characteristics of the TFT 30 can be greatly stabilized.

Moreover, the side portion 40 of the drain electrode 39 is formed to be inclined so that the thickness thereof reduces toward the side of the drain electrode 39, and thus, the part of the oxide semiconductor film 35 located under the side portion 40 can be subjected to resistance reduction process together with the drain portion (the pixel electrode) 22. Therefore, electrical coupling of the side portion 40 of the drain electrode 39 and the drain portion (the pixel electrode) 22 can be ensured.

Second Embodiment

Figure 14:
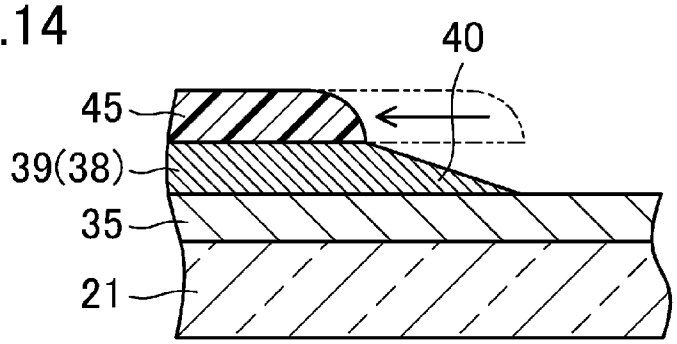
FIG. 14 is an enlarged cross-sectional view illustrating a side portion of a drain electrode to be etched according to a second embodiment of the present invention.

FIG. 14 illustrates a second embodiment of the present invention.

FIG. 14 is an enlarged cross-sectional view illustrating the side portion 40 of the drain electrode 39 to be etched according to the second embodiment. Note that in each of the following embodiments, similar parts to those shown in FIGS. 1-13 are identified by the same reference numerals and the detailed description thereof will not be repeated.

The second embodiment is different from the first embodiment in that a different method for forming the side portion 40 of the drain electrode 39 is adopted.

Specifically, according to the second embodiment, in the step of forming the source electrode 38 and the drain electrode 39, after forming a photoresist 45 on a surface of a conductive material layer 33, the conductive material layer 33 is dry etched. Thus, the source electrode 38 and the drain electrode 39 are formed, as shown in FIG. 13.

In this step, using an etching gas containing oxygen, the conductive material layer 33 is dry-etched while the photoresist 45 is gradually removed by oxidizing. Thus, the side portion 40 of the drain electrode 39 is formed to be inclined so that the thickness of the drain electrode 39 reduces toward the side of the drain electrode 39. Also, the side portion 40 of the source electrode 38 is formed to be inclined in the same manner as the side portion 40 of the drain electrode 39.

Therefore, according to the second embodiment, as in the first embodiment, the channel portion 34 and the drain portion (the pixel electrode) 22 are caused not to be directly adjacent to each other, and thus, expansion of resistance reduction process to the channel portion 34 can be prevented, and the effective length L of the channel portion 34 can be maintained constant. As result, characteristics of the TFT 30 can be preferably stabilized.

Moreover, since the side portion 40 of the drain electrode 39 is formed to be inclined, the part of the oxide semiconductor film 35 located under the side portion 40 can be subjected to resistance reduction process, thereby ensuring electrical coupling of the side portion 40 of the drain electrode 39 and the drain portion (the pixel electrode) 22.

Third Embodiment

Figure 15:
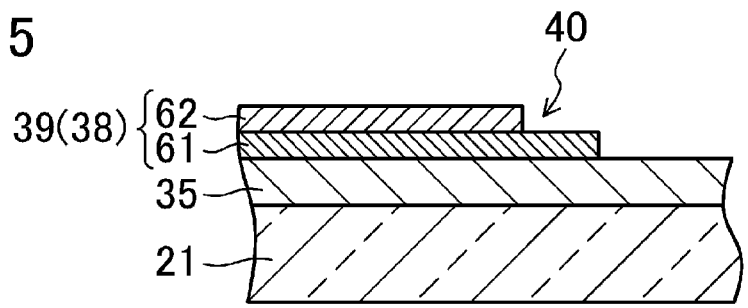
FIG. 15 is an enlarged cross-sectional view illustrating a side portion of a drain electrode to be etched according to a third embodiment of the present invention.

FIG. 15 illustrates a third embodiment of the present invention.

FIG. 15 is an enlarged cross-sectional view illustrating the side portion 40 of the drain electrode 39 to be etched according to the third embodiment.

As opposed to the first embodiment in which the side portions 40 of the drain electrode 39 and the source electrode 38 are formed to be inclined, the third embodiment is different from the first embodiment in that the side portion 40 is formed into a stepped shape.

Specifically, each of the drain electrode 39 and the source electrode 38 of the third embodiment includes a first conductive layer 61 and a second conductive layer 62. As the conductive material layer 33 of the first embodiment, the first conductive layer 61 and the second conductive layer 62 can be made of, for example, Ti, Al, Mo, Cu, Ta, W, or a nitride of one of the forefoing, etc.

The first conductive layer 61 is formed on a surface of the oxide semiconductor film 35, and the second conductive layer 62 is stacked on a surface of the first conductive layer 61 to have a smaller area than that of the first conductive layer 61. Thus, a side portion 40 of the drain electrode 39 is formed so that a thickness thereof reduces toward a side of the drain electrode 39.

Also, in this embodiment, in the step of forming the source electrode 38 and the drain electrode 39, a plurality of conductive material layers 33 are stacked on the oxide semiconductor film 35 to control an etching speed for etching each of the conductive material layers 33, thereby forming each of the side portions 40 of the source electrode 38 and the drain electrode 39 so that the thickness thereof reduces toward an associated one of sides of the source electrode 38 and the drain electrode 39.

Therefore, according to the third embodiment, as in the first embodiment, the channel portion 34 and the drain portion (the pixel electrode) 22 are caused not to be directly adjacent to each other, so that expansion of resistance reduction process to the channel portion 34 can be prevented. Thus, the effective length L of the channel portion 34 can be maintained constant, and the characteristics of the TFT 30 can be preferably stabilized. Furthermore, the side portion 40 of the drain electrode 39 is formed so that the thickness thereof reduces toward the side thereof, and thus, the part of the oxide semiconductor film 35 located under the side portion 40 can be subjected to resistance reduction process, thereby ensuring electrical coupling of the side portion 40 of the drain electrode 39 and the drain portion (the pixel electrode) 22.

Fourth Embodiment

Figure 16:
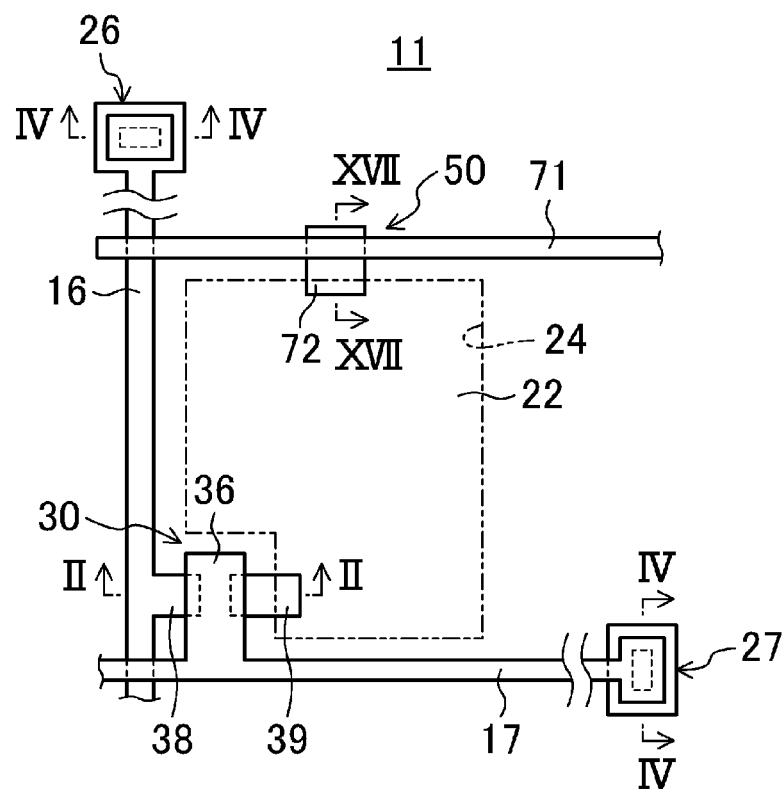
FIG. 16 is an enlarged plan view illustrating a part of a TFT substrate according to a fourth embodiment of the present invention.
Figure 17:
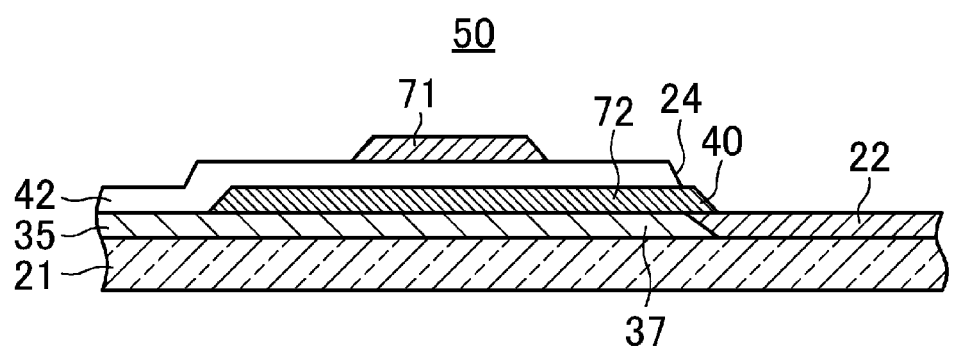
FIG. 17 is a cross-sectional view taken along the line XVII-XVII of FIG. 16.
Figure 18:
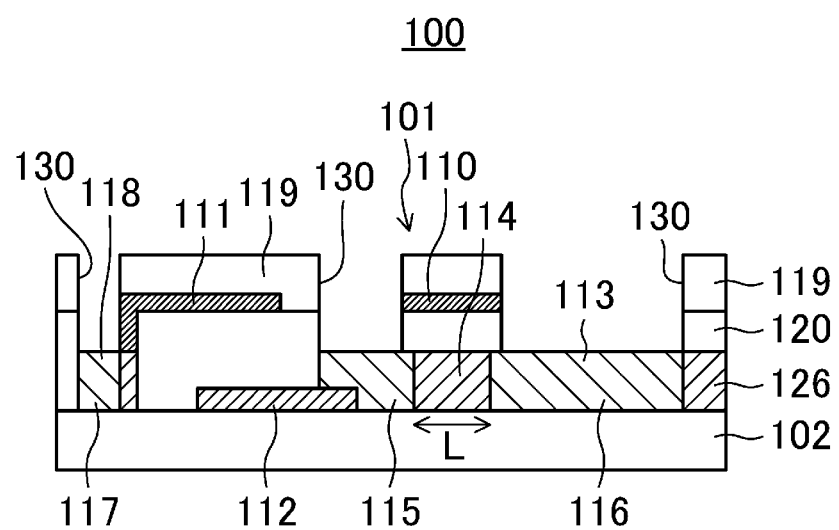
FIG. 18 is an enlarged cross-sectional view of a conventional active matrix substrate including a TFT.

FIGS. 16 and 17 illustrate a fourth embodiment of the present invention.

FIG. 16 is an enlarged plan view illustrating a part of the TFT substrate 11 according to the fourth embodiment. FIG. 17 is a cross-sectional view taken along the line XVII-XVII of FIG. 16.

As opposed to the first embodiment in which the auxiliary capacitance 50 includes the capacitance electrode 51 formed in the gate line 17 and the drain electrode 39, in the fourth embodiment, an auxiliary capacitance 50 is formed by providing an auxiliary capacitance line 71 separately and independently from the gate line 17.

As in the first embodiment, the TFT substrate 11 of this embodiment includes the TFTs 30 each including the oxide semiconductor film 35. Furthermore, in the TFT substrate 11, as shown in FIG. 16, the auxiliary capacitance line 71 is formed to extend parallel to the gate line 17, and as shown in FIG. 17, a capacitance electrode 72 is formed to be opposed to the auxiliary capacitance line 71 with the gate insulating film 42 interposed therebetween.

The auxiliary capacitance line 71 is made of the same material as that of the gate line 17. On the other hand, the capacitance electrode 72 is made of the same material as that of the source line 16. The capacitance electrode 72 has a similar structure to that of the drain electrode 39. Specifically, a side portion 40 of the capacitance electrode 72 is formed to be inclined so that a thickness of the side portion 40 reduces toward a side of the capacitance electrode 72. The capacitance electrode 72 is electrically coupled to the pixel electrode (the drain portion) 22 at the side portion 40. Thus, the liquid crystal capacitance formed in the pixel 15 can be maintained constant by the auxiliary capacitance 50.

Therefore, according to the fourth embodiment, as in the first embodiment, the effective length L of the channel portion 34 in the TFT 30 can be maintained constant, and characteristics of the TFT 30 can be stabilized. Furthermore, each of the side portions 40 of the drain electrode 39 and the capacitance electrode 72 is formed so that the thickness thereof reduces toward an associated one of sides of the drain electrode 39 and the capacitance electrode 72, so that parts of the oxide semiconductor film 35 located under the side portions 40 can be subjected to resistance reduction process, thereby ensuring electrical coupling of each of the side portions 40 of the drain electrode 39 and the capacitance electrode 72 and the drain portion (the pixel electrode) 22.

Other Embodiments

In each of the foregoing embodiments, the description has been made using a liquid crystal display device and a TFT substrate used therein as examples. However, the present invention is not limited thereto and is applicable in a similar manner to other display devices such as, for example, an organic EL display device, and an active matrix substrate used therein. Moreover, the foregoing embodiments may be combined with one another as necessary.

INDUSTRIAL APPLICABILITY

As described above, the present is useful for a semiconductor device, a method for fabricating a semiconductor device, and an active matrix substrate.

DESCRIPTION OF REFERENCE CHARACTERS

1 Liquid crystal display device
11 TFT substrate (active matrix substrate)
15 Pixel
21 Insulative substrate
22 Pixel electrode, drain portion
30 TFT (semiconductor device, a thin film transistor)
33 Conductive material layer
34 Channel portion
35 Oxide semiconductor film
36 Gate portion
37 Intermediate area
38 Source electrode
39 Drain electrode (conductive film)
40 Side portion
45 Photoresist
61 First conductive layer
62 Second conductive layer

The invention claimed is:

1. A semiconductor device, comprising:
   an oxide semiconductor film in which a channel portion is formed; and
   a gate portion arranged to be opposed to the channel portion of the oxide semiconductor film, wherein
   a drain portion in which the oxide semiconductor film has been subjected to resistance reduction process and an intermediate area which is provided between the drain portion and the channel portion and has not been subjected to resistance reduction process are formed in the oxide semiconductor film, and
   a conductive film is arranged to cover the intermediate area so that the intermediate area is not subjected to resistance reduction process, and
   wherein a side portion of the conductive film consisting of a drain electrode so that a thickness of the conductive film reduces toward a side of the conductive film.

2. The semiconductor device of claim 1, wherein
   the oxide semiconductor film is made of an oxide containing at least one element of In, Ga, and Zn.

3. An active matrix substrate, comprising:
   an insulative substrate;
   a plurality of pixel electrodes arranged in a matrix on the insulative substrate; and a thin film transistor provided for each of the plurality of pixel electrodes to be connected the pixel electrode, wherein
   the thin film transistor includes an oxide semiconductor film in which a channel portion is formed and a gate portion arranged to be opposed to the channel portion of the oxide semiconductor film,
   the pixel electrode is formed by performing resistance reduction process to a part of the oxide semiconductor film,
   an intermediate area which is provided between the pixel electrode and the channel portion and has not been subjected to resistance reduction process is formed in the oxide semiconductor film, and
   a conductive film is arranged to cover the intermediate area so that the intermediate area is not subjected to resistance reduction process, and
   wherein a side portion of the conductive film consisting a drain electrode so that a thickness of the conductive film reduces toward a side of the conductive film.

4. The active matrix substrate of claim 3, wherein
   the oxide semiconductor film is made of an oxide containing at least one element of In, Ga, and Zn.

5. A display device including the active matrix substrate of claim 3.

6. The display device of claim 5, wherein
   a side portion of the conductive film is formed so that a thickness of the conductive film reduces toward a side of the conductive film.

7. The display device of claim 5, wherein
   the conductive film is a drain electrode.

8. The display device of claim 5, wherein
   the oxide semiconductor film is made of an oxide containing at least one element of In, Ga, and Zn.

* * * * *